(12) United States Patent
Park et al.

(10) Patent No.: US 9,653,356 B2
(45) Date of Patent: May 16, 2017

(54) METHODS OF FORMING SELF-ALIGNED DEVICE LEVEL CONTACT STRUCTURES

(71) Applicant: GLOBALFOUNDRIES Inc., Grand Cayman (KY)

(72) Inventors: Chanro Park, Clifton Park, NY (US); Ruilong Xie, Niskayuna, NY (US); Min Gyu Sung, Latham, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/822,340

(22) Filed: Aug. 10, 2015

(65) Prior Publication Data

US 2017/0047253 A1    Feb. 16, 2017

(51) Int. Cl.
*H01L 21/768* (2006.01)
*H01L 21/02* (2006.01)
*H01L 27/088* (2006.01)
*H01L 21/311* (2006.01)
*H01L 29/66* (2006.01)
*H01L 21/3105* (2006.01)
(Continued)

(52) U.S. Cl.
CPC .... *H01L 21/76897* (2013.01); *H01L 21/0217* (2013.01); *H01L 21/02164* (2013.01); *H01L 21/02362* (2013.01); *H01L 21/31051* (2013.01); *H01L 21/31055* (2013.01); *H01L 21/31105* (2013.01); *H01L 21/76802* (2013.01); *H01L 21/823437* (2013.01); *H01L 21/823475* (2013.01); *H01L 27/088* (2013.01); *H01L 29/401* (2013.01); *H01L 29/41758* (2013.01); *H01L 29/66545* (2013.01); *H01L 29/66553* (2013.01)

(58) Field of Classification Search
CPC ......... H01L 21/76897; H01L 21/02164; H01L 21/0217; H01L 21/0262; H01L 21/31051; H01L 21/1055; H01L 21/76802; H01L 21/823437; H01L 21/823475; H01L 27/088; H01L 29/401; H01L 29/4178; H01L 29/66545
See application file for complete search history.

(56) References Cited

U.S. PATENT DOCUMENTS

| 6,392,280 B1* | 5/2002 | Besser | H01L 21/28194 |
| | | | 257/295 |
| 2005/0055494 A1* | 3/2005 | Doris | H01L 21/28079 |
| | | | 711/103 |

(Continued)

*Primary Examiner* — John C Ingham
*Assistant Examiner* — Gustavo Ramallo
(74) *Attorney, Agent, or Firm* — Amerson Law Firm, PLLC

(57) ABSTRACT

One illustrative method disclosed includes, among other things, forming a silicon dioxide etch stop layer on and in contact with a source/drain region and adjacent silicon nitride sidewall spacers positioned on two laterally spaced-apart transistors having silicon dioxide gate cap layers, performing a first etching process through an opening in a layer of insulating material to remove the silicon nitride material positioned above the source/drain region, performing a second etching process to remove a portion of the silicon dioxide etch stop layer and thereby expose a portion of the source/drain region, and forming a conductive self-aligned contact that is conductively coupled to the source/drain region.

20 Claims, 18 Drawing Sheets

(51) Int. Cl.
    *H01L 29/40*     (2006.01)
    *H01L 29/417*    (2006.01)
    *H01L 21/8234*   (2006.01)

(56) References Cited

U.S. PATENT DOCUMENTS

2013/0137257 A1*  5/2013  Wei .................. H01L 21/76897
                                                    438/586
2013/0203262 A1*  8/2013  Butterbaugh ..... H01L 21/31111
                                                    438/748

* cited by examiner

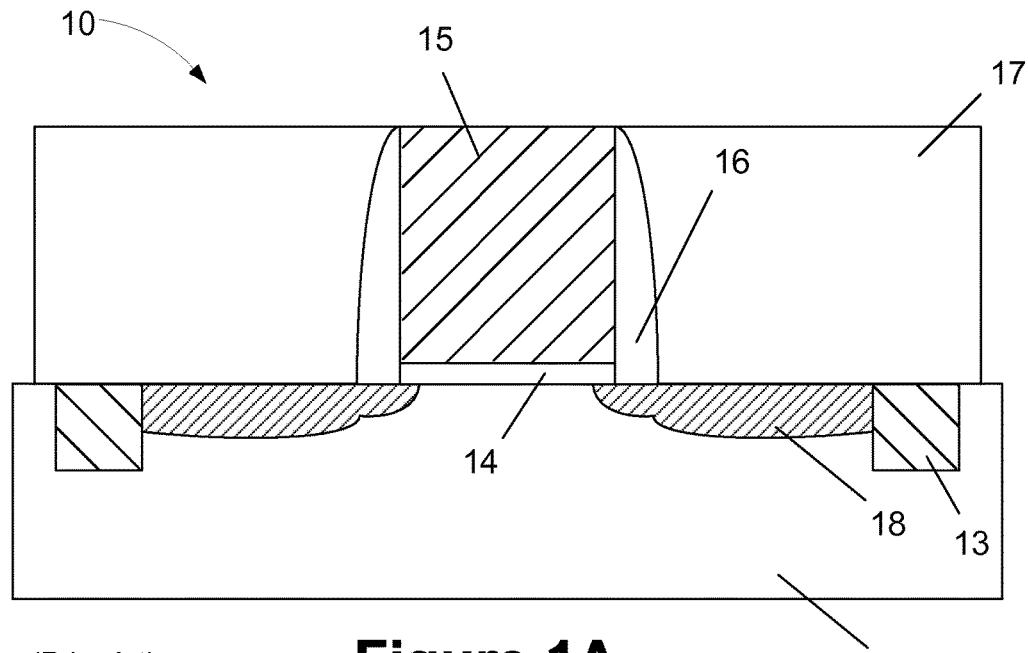
(Prior Art) Figure 1A
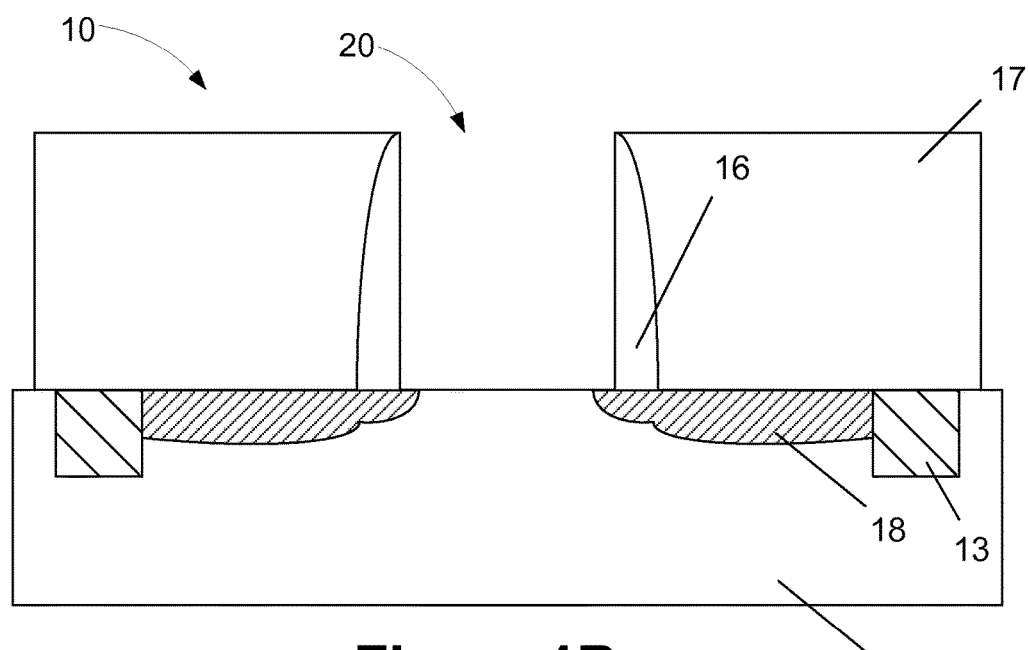
(Prior Art) Figure 1B

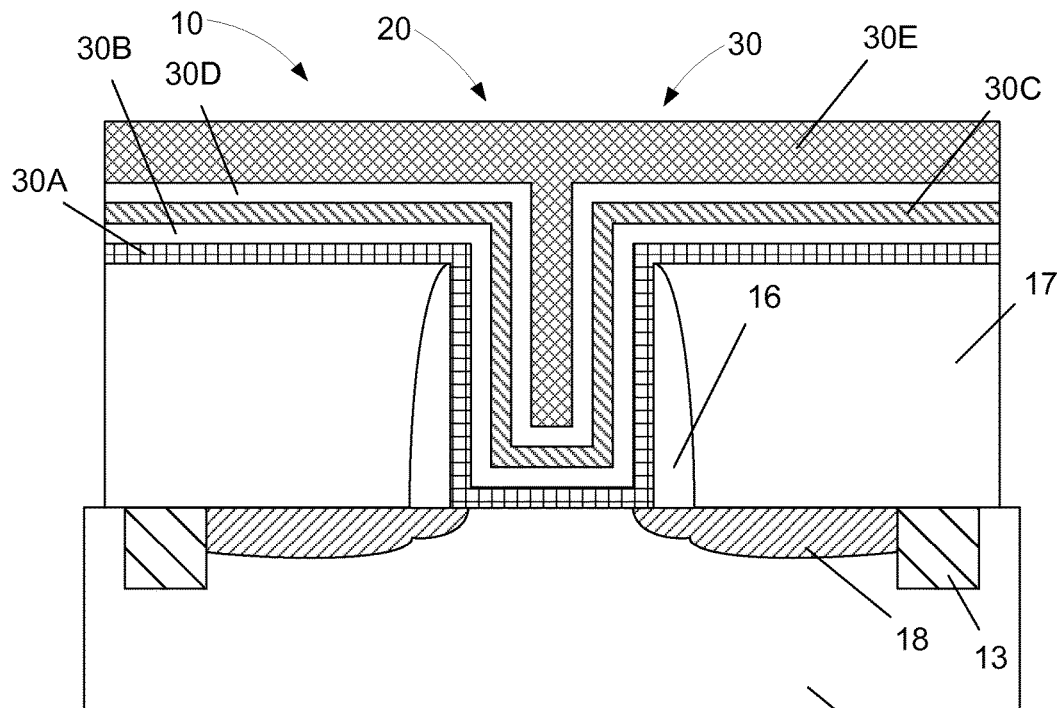
(Prior Art) Figure 1C
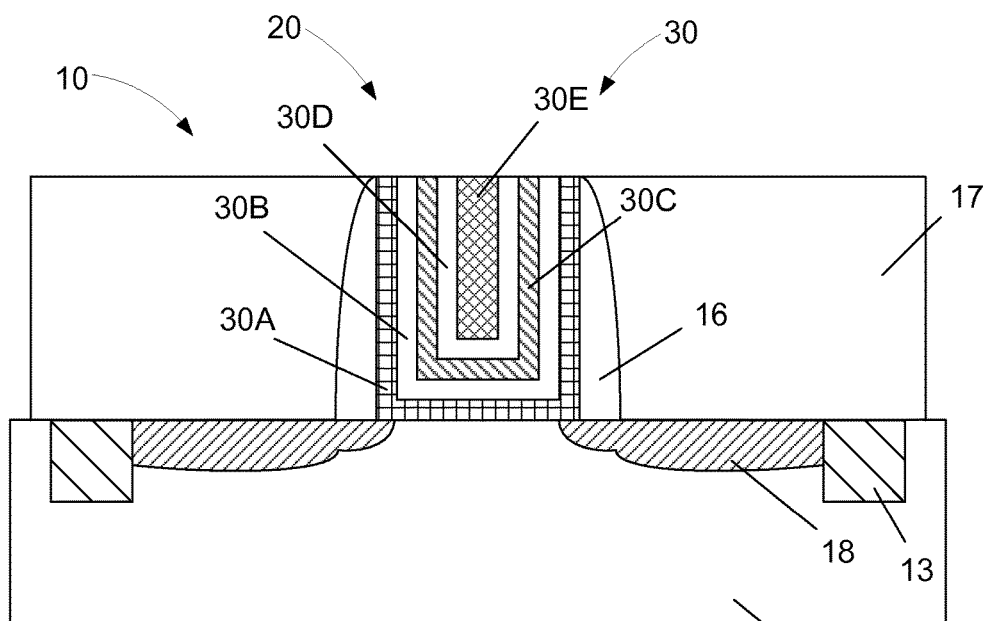
(Prior Art) Figure 1D

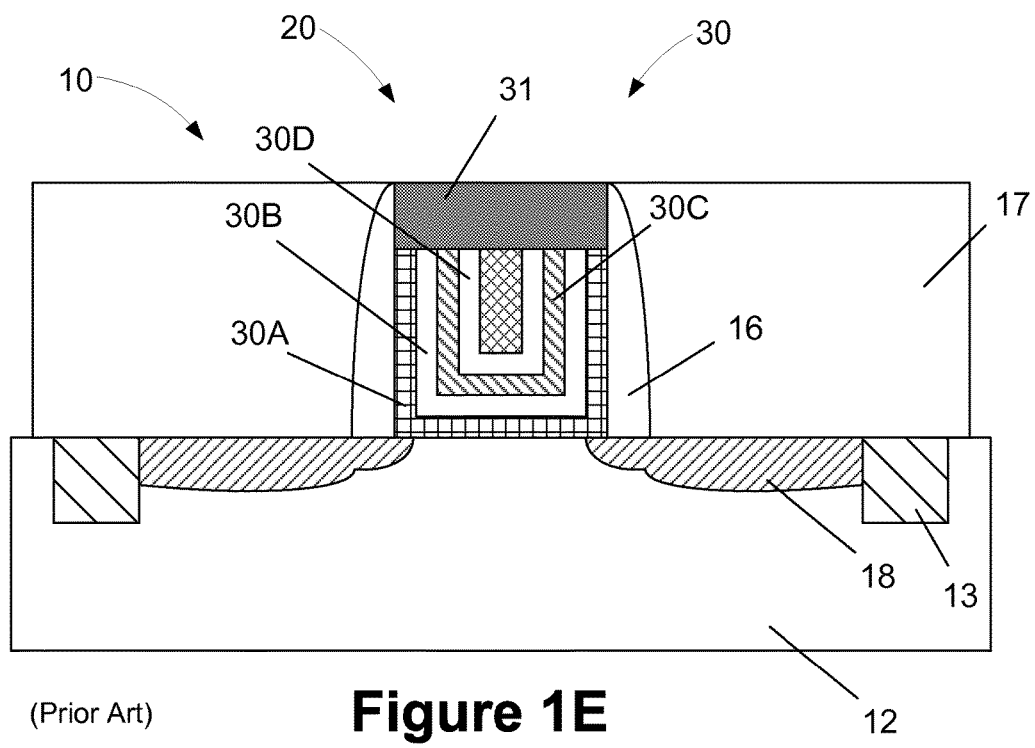
(Prior Art) Figure 1E

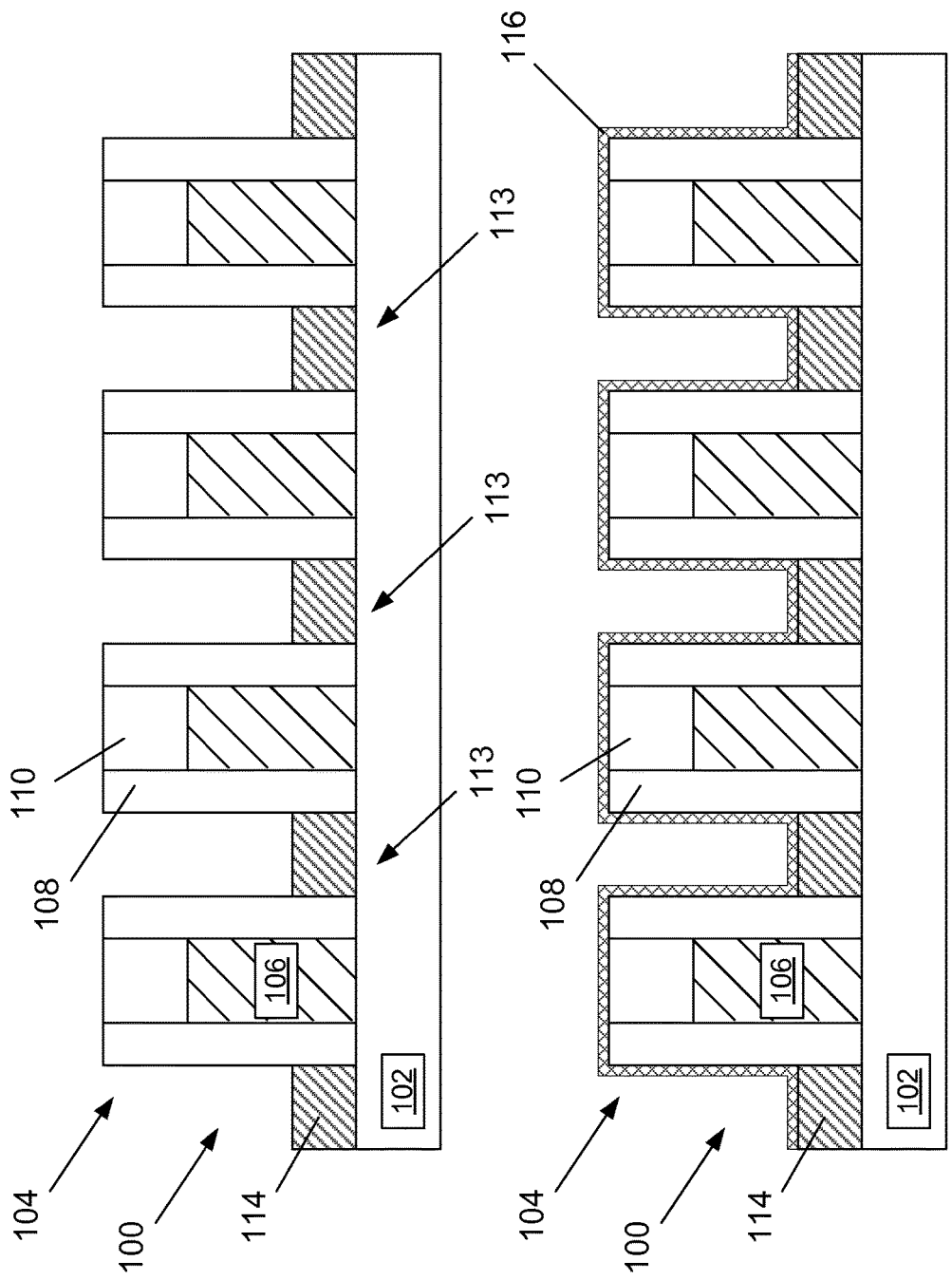

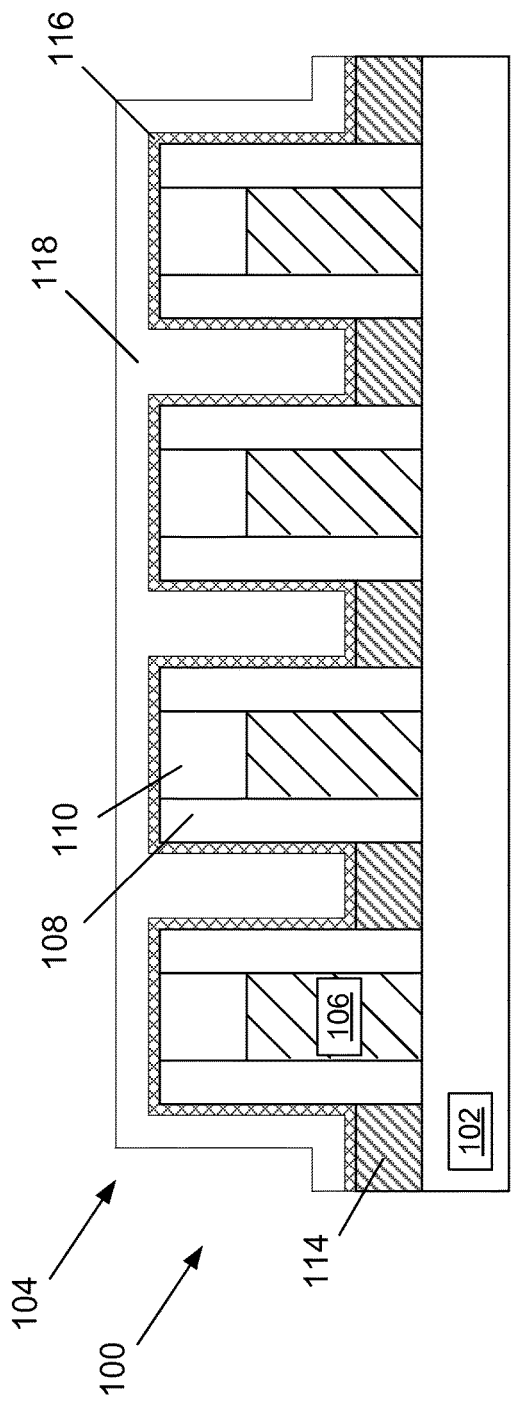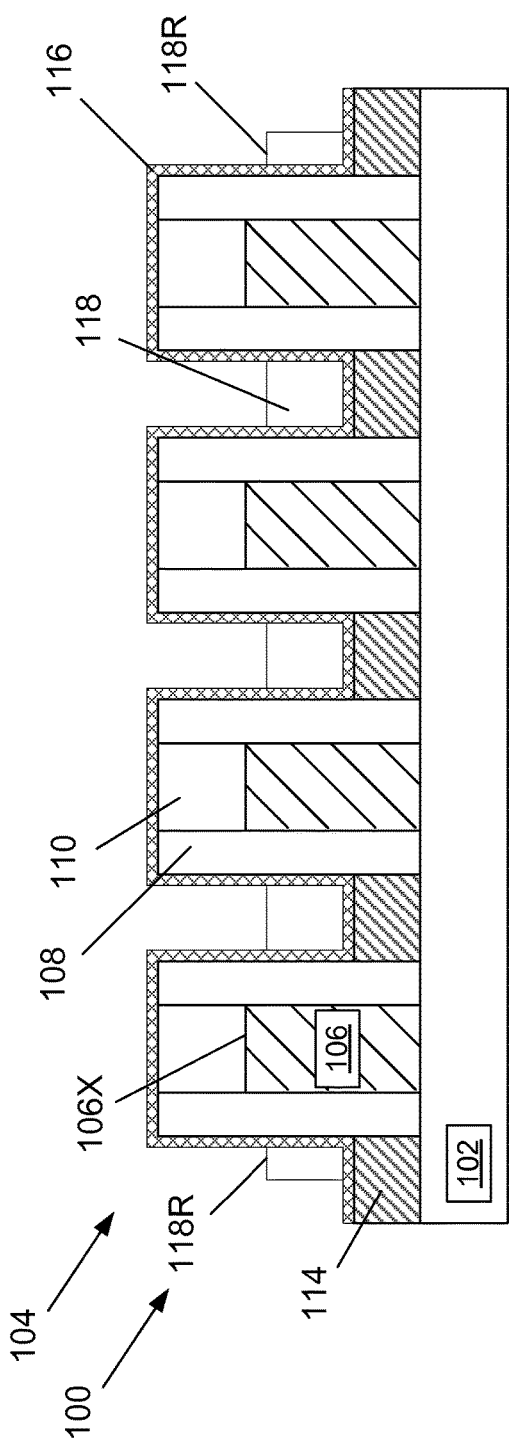

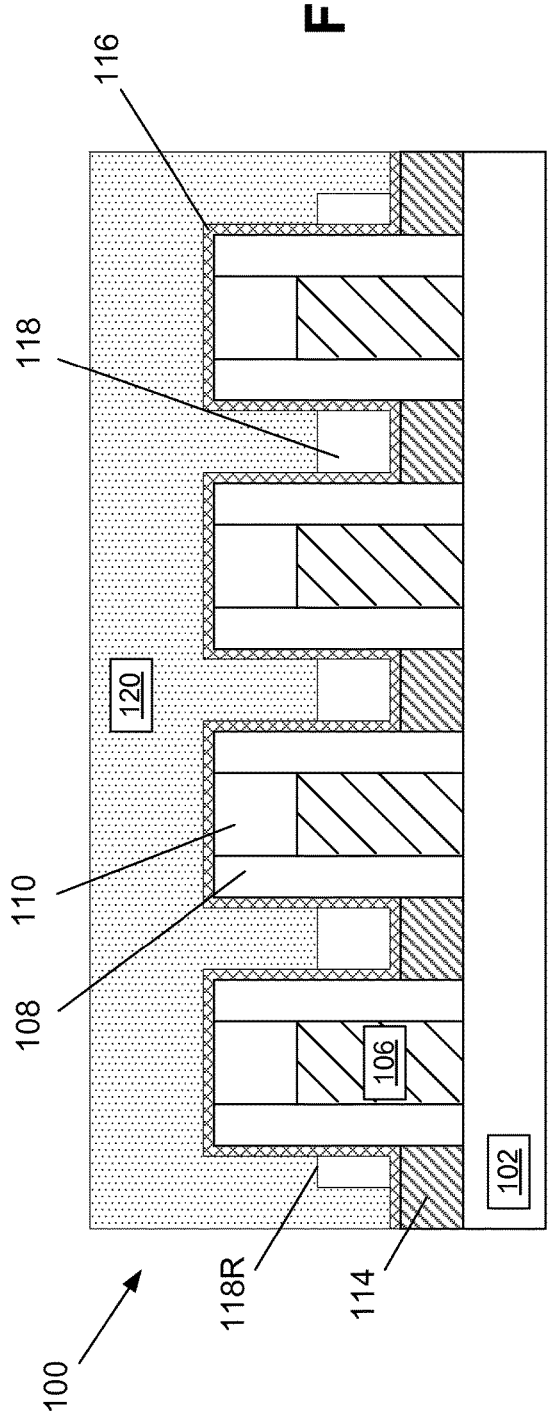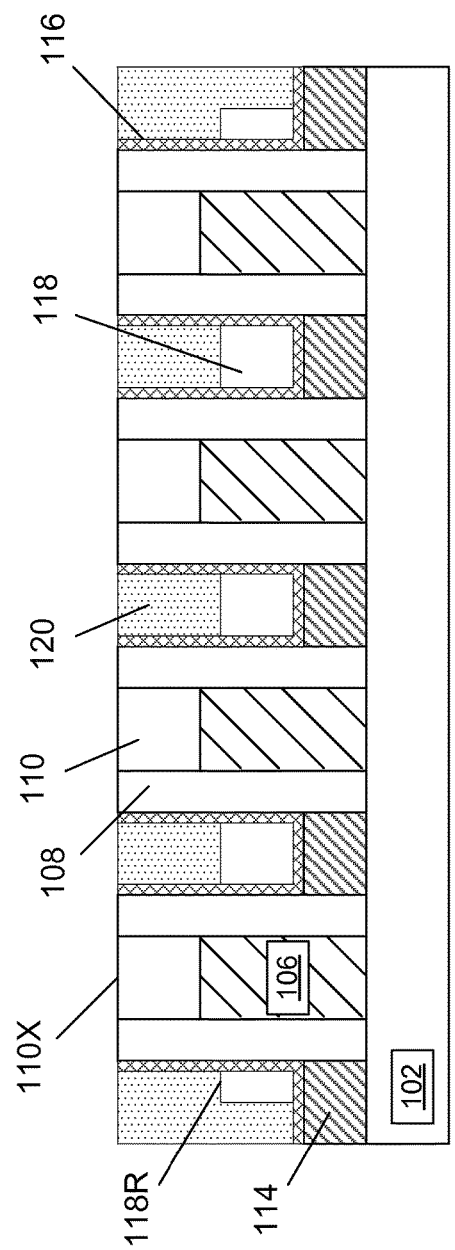

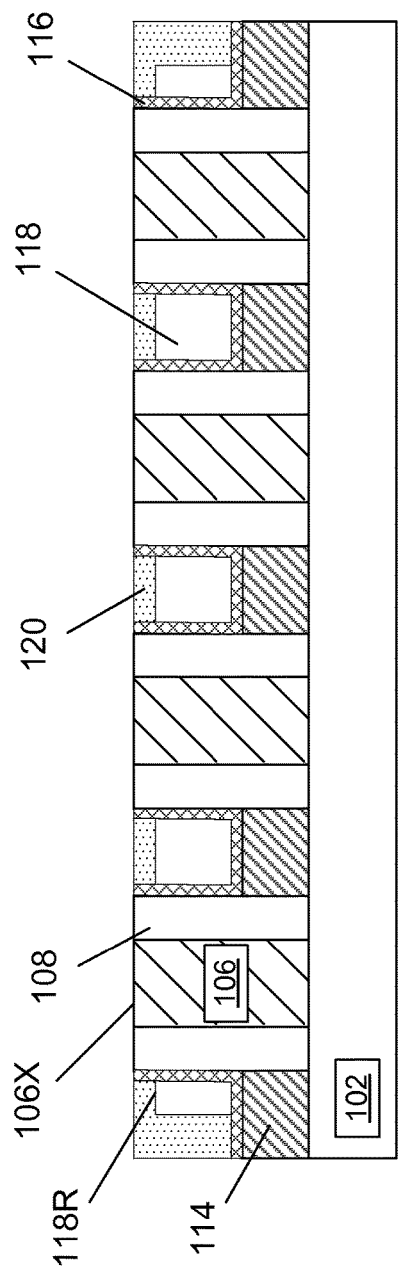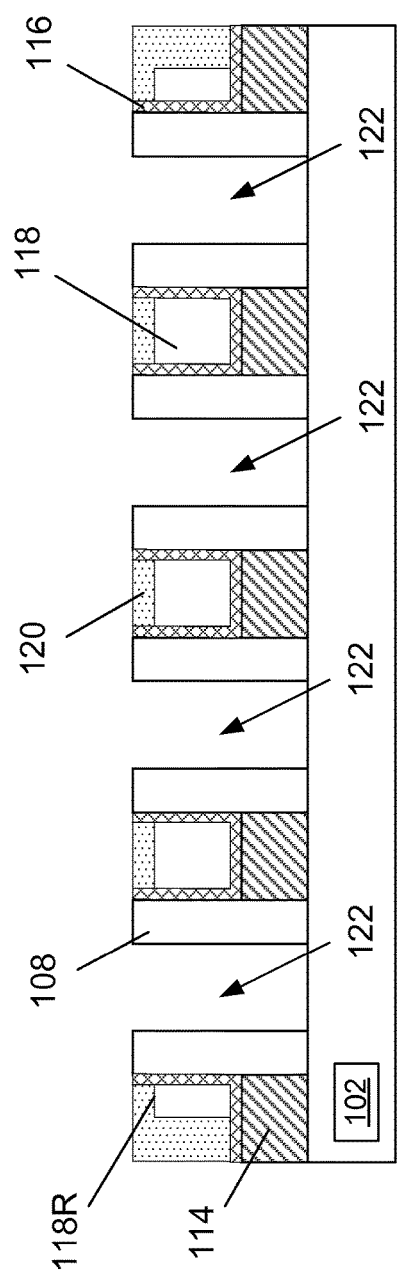

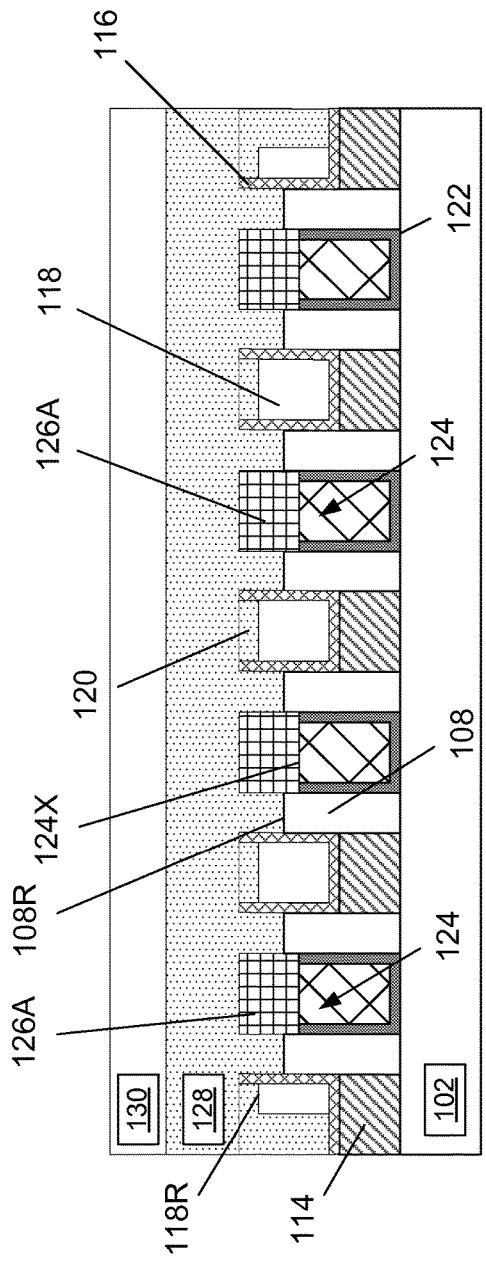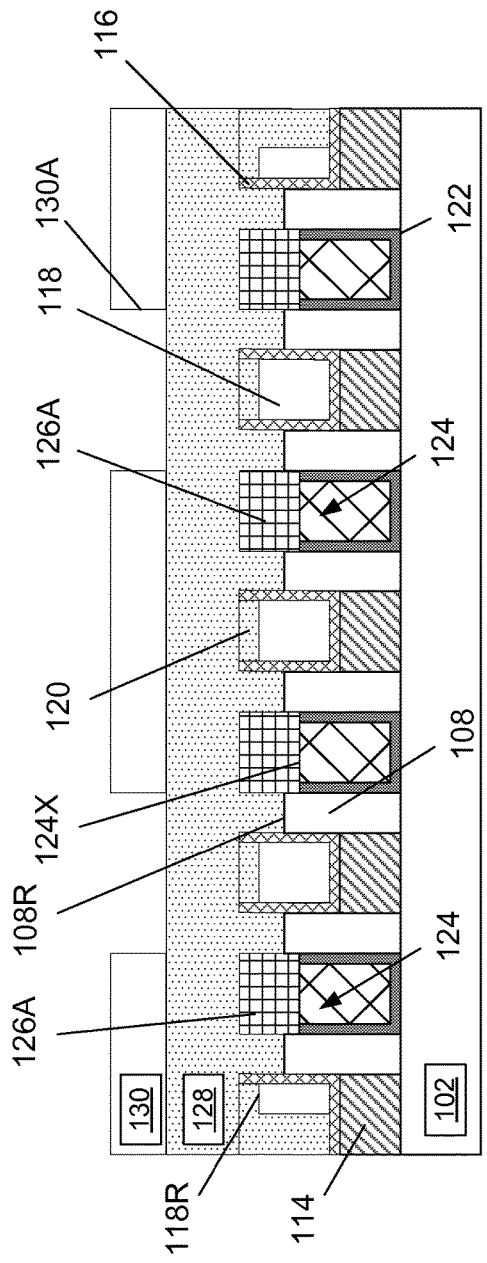

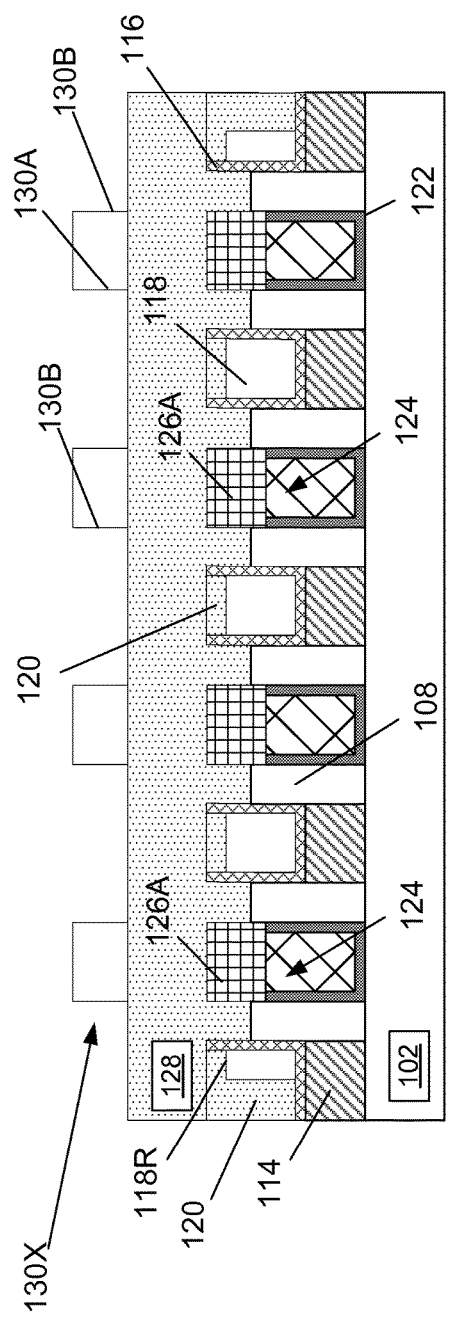
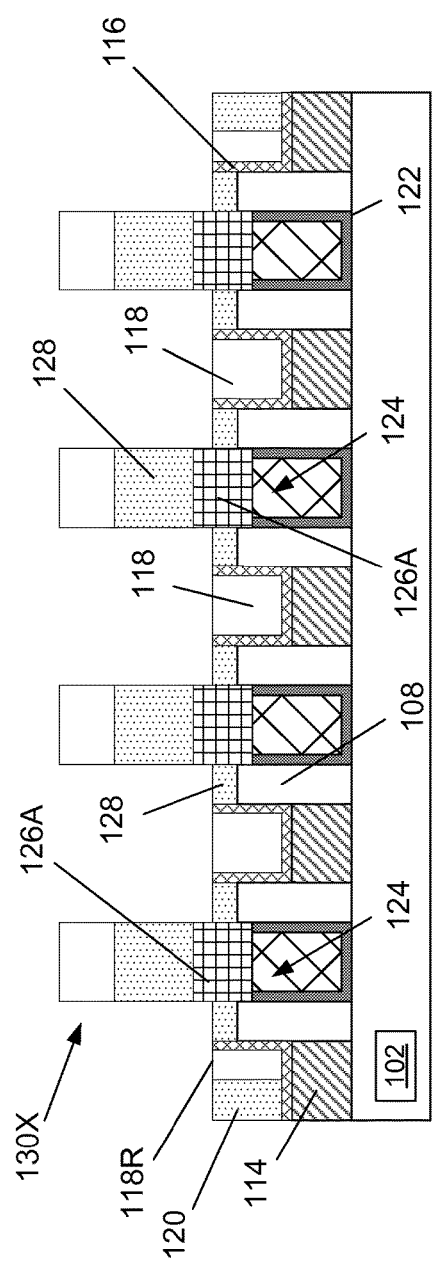

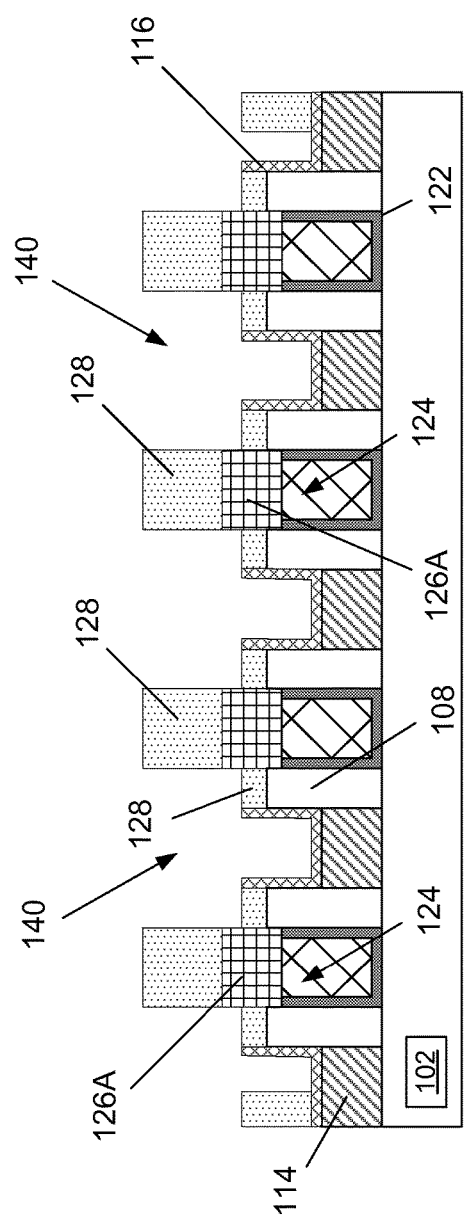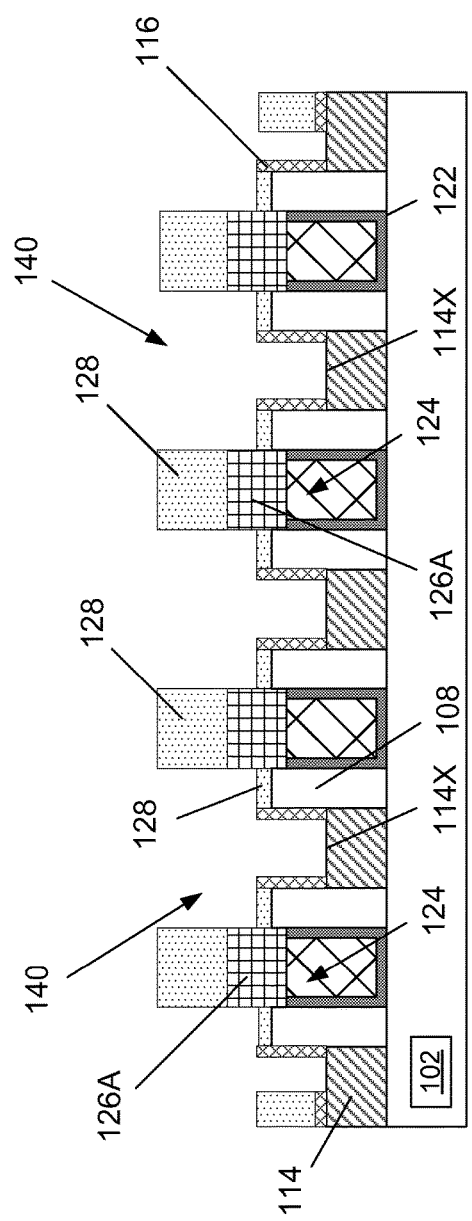

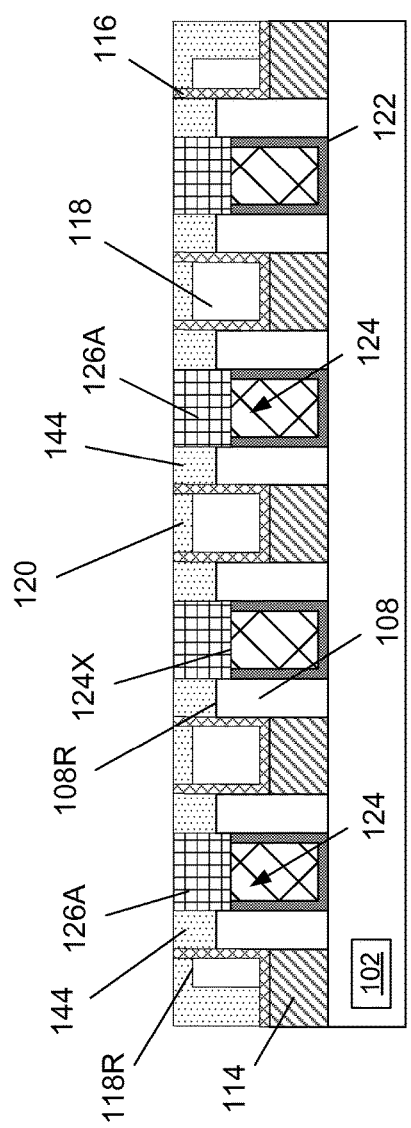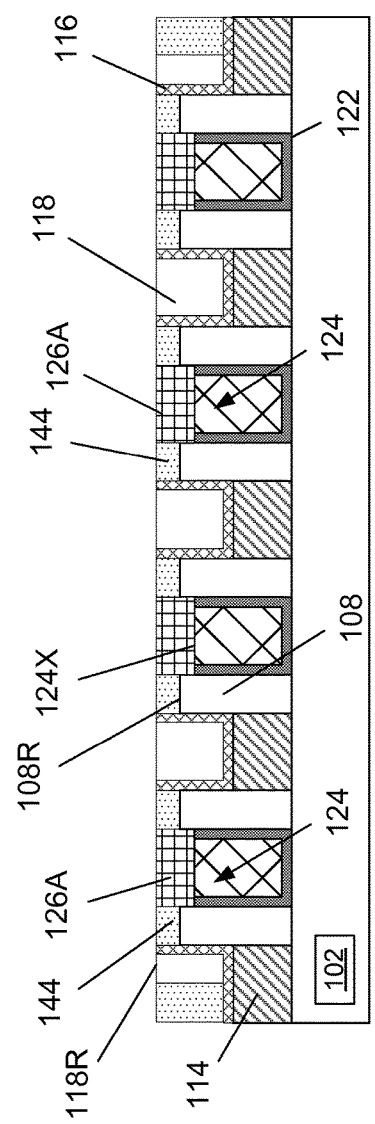

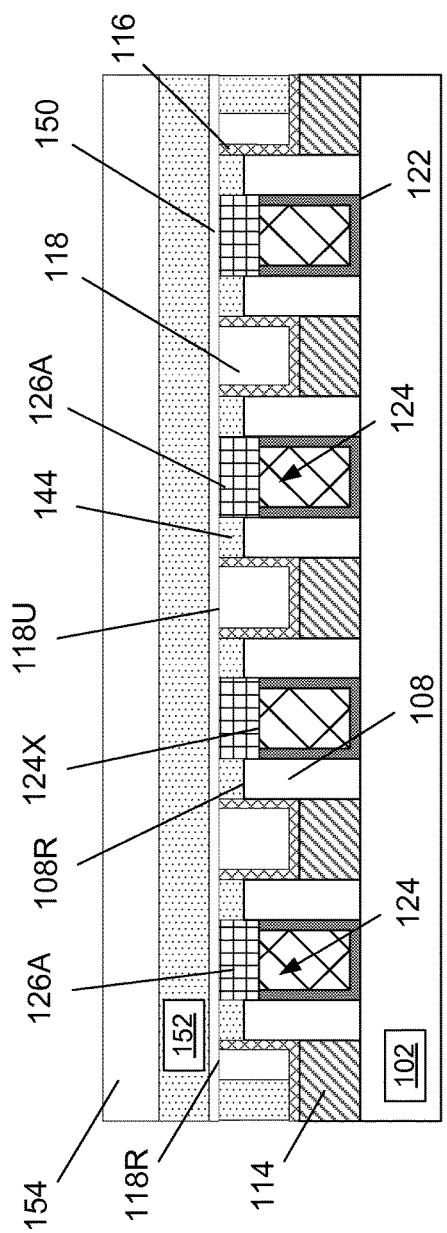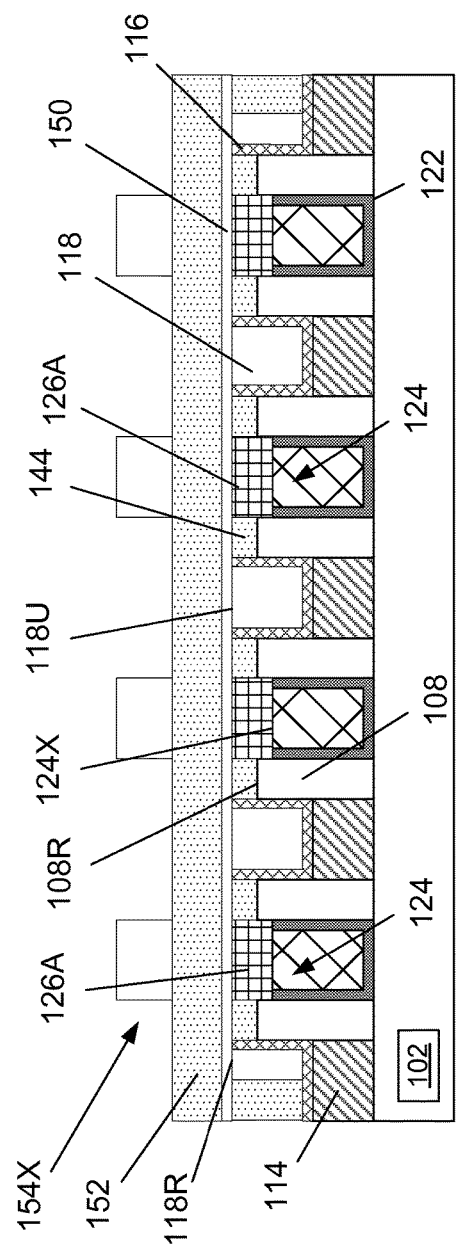

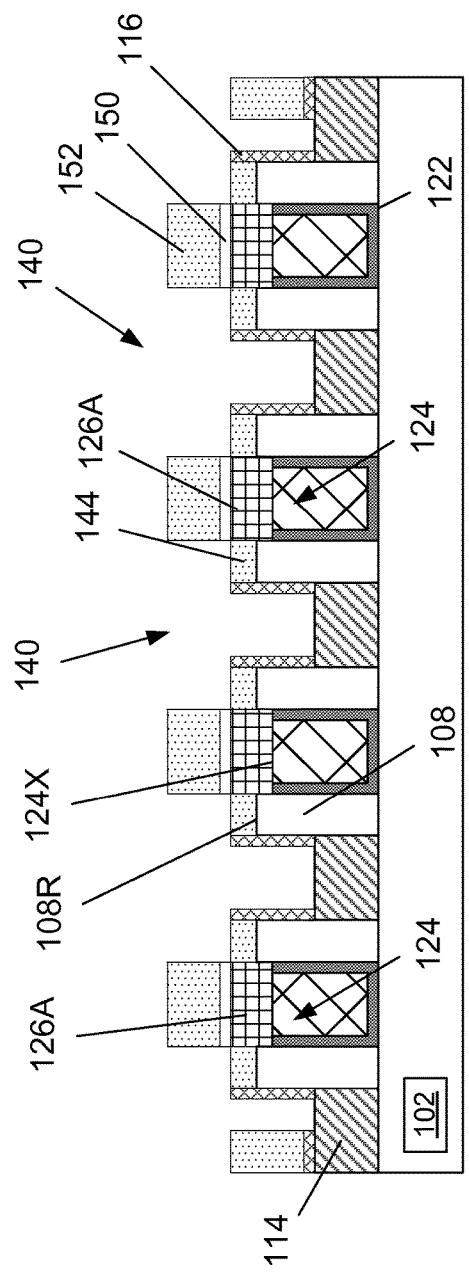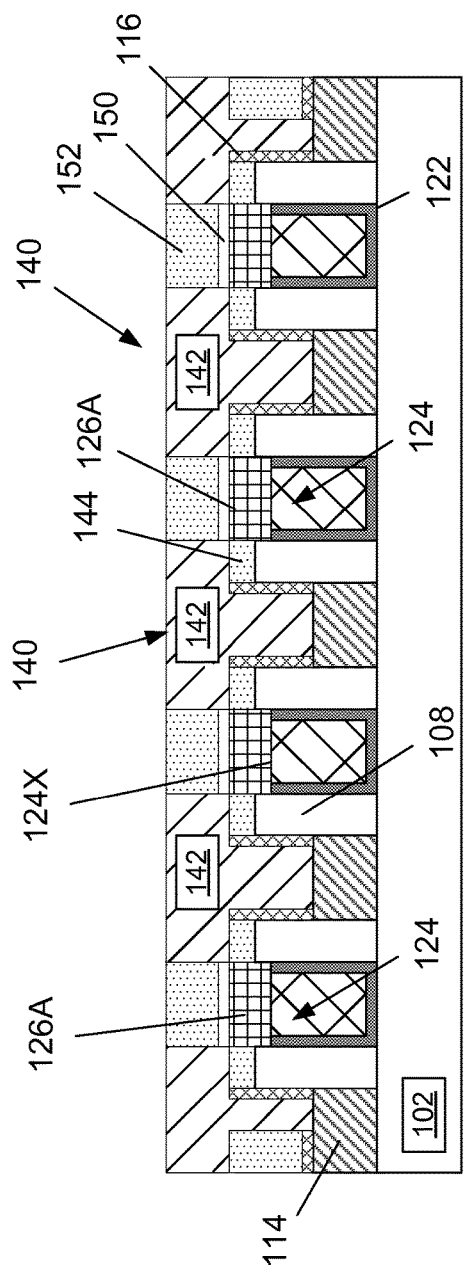

METHODS OF FORMING SELF-ALIGNED DEVICE LEVEL CONTACT STRUCTURES

BACKGROUND OF THE INVENTION

1. Field of the Invention

The present disclosure generally relates to the fabrication of integrated circuits, and, more particularly, to various methods of forming self-aligned device level contact structures on integrated circuit products.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region. The gate structures for such transistor devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded. In contrast to a planar transistor device, which as the name implies has a generally planar structure, a so-called FinFET device has a three-dimensional (3D) structure. That is, the gate structure of a FinFET device may be positioned around both the sides and the upper surface of a portion of a fin that was previously defined in the substrate to thereby form a tri-gate structure so as to use a channel having a three-dimensional structure instead of a planar structure. That is, unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. For a given plot space (or foot-print), FinFETs tend to be able to generate significantly higher drive current density than planar transistor devices.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode and a silicon nitride gate cap layer. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

One well-known processing method that has been used for forming a transistor with a high-k/metal gate structure is the so-called "gate last" or "replacement gate" technique. The replacement gate process may be used when forming planar devices or 3D devices. FIGS. 1A-1E simplistically depict one illustrative prior art method for forming an HK/MG replacement gate structure using a replacement gate technique on a planar transistor device. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, a sidewall spacer 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon or amorphous silicon, the sidewall spacer 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective gate cap layer (not shown) comprised of silicon nitride) so that at least the sacrificial gate electrode 15 may be removed.

FIG. 1B depicts the device 10 after one or more etching processes were performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, a first metal layer 30B (e.g., a layer of titanium nitride), a second metal layer 30C—a so-called work function adjusting metal layer for the NMOS device—(e.g., a layer of titanium-aluminum or titanium-aluminum-carbon), a third metal layer 30D (e.g., a layer of titanium nitride) and a bulk metal layer 30E, such as aluminum or tungsten. Of course, other material combinations are possible.

Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride (the work function adjusting metal for the PMOS device) and the bulk metal layer 30E.

FIG. 1E depicts the device 10 after several process operations were performed. First, one or more etching processes were performed to remove upper portions of the various materials within the gate cavity 20 so as to form a recess within the gate cavity 20. Then, a gate cap layer 31 comprised of silicon nitride was formed in the recess above the recessed gate materials. The gate cap layer 31 may be formed by depositing a layer of gate cap material so as to over-fill the recess formed in the gate cavity 20 and, thereafter, performing a CMP process to remove excess portions of the gate cap material layer positioned above the surface of the layer of insulating material 17. The gate cap layer 31 is formed so as to protect the underlying gate materials during subsequent processing operations.

In the case of a gate-first process, the material(s) of the gate insulation layer are initially formed above the substrate 12, typically by oxidation (silicon dioxide) or by deposition (a high-k insulating material). Thereafter, the material(s) that will constitute the gate electrode structure (e.g., polysilicon or one or more layers of metal) are deposited above the gate insulation layer. Thereafter, the material for the gate cap layer, e.g., silicon nitride, is deposited above the uppermost gate material layer. A patterned layer of photoresist is then formed above the layer of gate cap material and an etching process is performed to pattern the layer of gate cap material. The patterned layer of photoresist is then removed and the gate material(s) are patterned by performing one or more etching processes using the patterned gate cap layer as an etch mask. Thereafter, silicon nitride spacers are formed adjacent the patterned gate electrode structure which, in combination with the gate cap layer, serves to encapsulate and protect the gate electrode.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the performance of the individual transistor elements but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements (e.g., transistors) formed in the semiconductor material with the metallization layers, an appropriate vertical device level contact structure is provided, a first end of which is connected to a respective contact region of a circuit element, such as a gate electrode and/or the drain and source regions of a transistor, and a second end that is connected to a respective metal line in the so-called M1 metallization layer by a conductive via. As device dimensions have decreased, the conductive device level contact elements have to be provided with critical dimensions on the same order of magnitude. The device level contact elements typically represent plugs or lines, which are formed of an appropriate metal or metal composition, wherein, in sophisticated semiconductor devices, tungsten, in combination with appropriate barrier materials, has proven to be a viable contact metal. For this reason, device level contact technologies have been developed in which contact openings are formed in a self-aligned manner by removing dielectric material, such as silicon dioxide, selectively from the spaces between closely spaced gate structures. That is, after completing the transistor structure, the silicon nitride materials (the spacer 16 and the gate cap layer 31) that surround and encapsulate the gate electrode structures 30 are effectively used as etch masks for selectively removing the silicon dioxide material between adjacent gate structures in order to expose the source/drain regions of the transistors, thereby providing self-aligned trenches or openings which are substantially laterally delineated by the spacer structures 16 on adjacent gate electrode structures 30.

However, the aforementioned process of forming self-aligned contacts can result in an undesirable loss of the materials that protect the conductive gate electrode, i.e., the gate cap layer and/or the sidewall spacer, as will be explained with reference to FIGS. 2A-2B. FIG. 2A schematically illustrates a cross-sectional view of an integrated circuit product 40 at an advanced manufacturing stage. As illustrated, the product 40 comprises a plurality of illustrative and simplistically depicted gate structures 41 that are formed above a substrate 42, such as a silicon substrate. The gate structures 41 are comprised of an illustrative gate insulation layer 43 and an illustrative gate electrode 44 that are formed in a gate cavity 45 using a gate-last or replacement-gate processing technique. An illustrative gate cap layer 46 and a sidewall spacer 48 encapsulate and protect the gate structures 41. The gate cap layer 46 and the sidewall spacer 48 are typically made of silicon nitride. Also depicted in FIG. 2A are a plurality of raised source/drain regions 50 and a layer of insulating material 52, e.g., silicon dioxide.

FIG. 2B depicts the product 40 after a self-aligned contact opening 54 was formed in the layer of insulating material 52 for a self-aligned contact through a patterned etch mask, e.g. photoresist (not shown). Depending upon the pitch of the gate structures 41, the formation of the contact openings 54 may be done with a single etch mask layer or it may be done using two or more different etch masks. Although the contact etch process performed to form the opening 54 is primarily directed at removing the desired portions of the layer of insulating material 52 (e.g., silicon dioxide), portions of the protective gate cap layer 46 (silicon nitride) and the protective sidewall spacers 48 (silicon nitride) also get consumed during the contact etch process, as simplistically depicted in the dashed regions 56. Loss of protective material in the region 56 can lead to exposure of the conductive gate electrode of the gate structure 41 and create an electrical short with the conductive device level contact that will be formed in the contact opening 54. Such an electrical short can render the affected transistors inoperable for their intended purpose.

Given that the cap layer 46 and the spacers 48 are attacked in the contact etch process, the thickness of these protective materials must be sufficient such that, even after the contact etch process is completed, there remains sufficient cap layer material and spacer material to protect the gate structures 41. Accordingly, device manufacturers tend to make the cap layers 46 and spacers 48 "extra thick," i.e., with an additional thickness that may otherwise not be required but for the consumption of the cap layers 46 and the spacers 48 during the contact etch process. In turn, increasing the thickness of such structures, i.e., increasing the thickness of the gate cap layers 46, causes other problems, such as increasing the aspect ratio of the contact opening 54 due to the increased height, increasing the initial gate height, which makes the gate etching and spacer etching processes more difficult, etc.

What is needed in the art is a novel process flow that addresses and corrects or lessens at least some of the problems identified above. Accordingly, the present disclosure is directed to various methods of forming self-aligned device level contact structures on integrated circuit products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned device level contact structures on integrated circuit products. One illustrative method disclosed includes, among other things, forming a silicon dioxide etch stop layer on and in contact with a source/drain region and adjacent silicon nitride sidewall spacers positioned on two laterally spaced-apart transistors having silicon dioxide gate cap layers, forming a silicon nitride material on and in contact with the silicon dioxide etch stop layer and above the source/drain region, and forming a layer of insulating material above the two laterally spaced-apart transistors and above the silicon nitride material positioned on the silicon dioxide etch stop layer. In this example, the method also includes forming an opening in the layer of insulating material that exposes the silicon nitride material positioned on the silicon dioxide etch stop layer, performing a first etching process to remove the silicon nitride material positioned on the silicon dioxide etch stop layer so as to thereby define a self-aligned contact opening, wherein portions of the silicon dioxide gate cap layers on the two laterally spaced-apart transistors are exposed to the first etching process, performing a second etching process through the self-aligned contact opening so as to remove a portion of the silicon dioxide etch stop layer and thereby expose a portion of the source/drain region, and forming the conductive self-aligned contact in the self-aligned contact opening such that the self-aligned contact is conductively coupled to the source/drain region.

Another illustrative method disclosed herein includes, among other things, forming first and second gate structures and first and second silicon nitride sidewall spacers positioned adjacent sidewalls of each of the first and second gate structures, respectively, wherein each of the first and second gate structures comprises a gate electrode, a gate insulation layer and a silicon dioxide gate cap layer positioned on and in contact with the gate electrode. The method also includes performing a conformal deposition process to form a silicon dioxide etch stop layer on and in contact with the source/drain region and on and in contact with the first and second sidewall spacers, forming a silicon nitride material on and in contact with the silicon dioxide etch stop layer and above the source/drain region, forming a layer of silicon dioxide above the first and second gate structures and above the silicon nitride material positioned on and in contact with the silicon dioxide etch stop layer, and performing a first etching process to define an opening in the layer of silicon dioxide that exposes the silicon nitride material positioned on and in contact with the silicon dioxide etch stop layer. In this particular example, the method also includes performing a second etching process to remove the silicon nitride material positioned on and in contact with the silicon dioxide etch stop layer so as to thereby define a self-aligned contact opening, performing a third etching process through the self-aligned contact opening so as to remove a portion of the silicon dioxide etch stop layer and thereby expose a portion of the source/drain region, and forming the conductive self-aligned contact in the self-aligned contact opening such that the self-aligned contact is conductively coupled to the source/drain region.

One illustrative device disclose herein includes a silicon dioxide etch stop layer positioned on and in contact with a source/drain region and on and in contact with silicon nitride sidewall spacers positioned on two laterally spaced-apart transistors having silicon dioxide gate cap layers and a conductive self-aligned contact that extends through an opening in the silicon dioxide etch stop layer and is conductively coupled to the source/drain region.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict one illustrative prior art method of forming a gate structure of a transistor using a so-called "replacement gate" or "gate-last" manufacturing technique;

FIGS. 4A-4I depict another illustrative method disclosed herein for forming self-aligned device level contact structures on integrated circuit products.

Figure 2A:
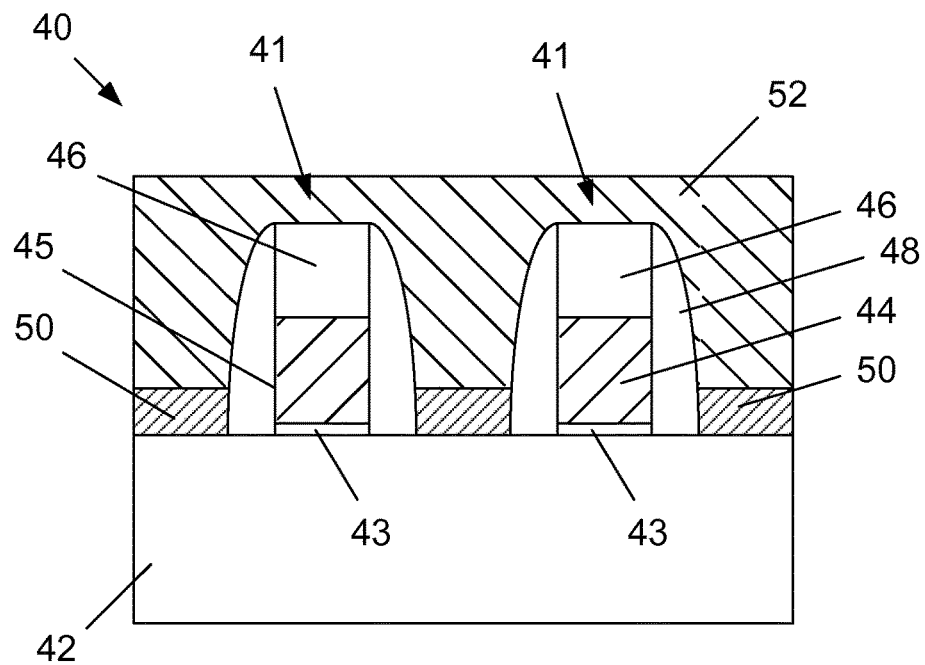
FIGS. 2A-2B schematically illustrate a cross-sectional view of an illustrative prior art integrated circuit product that employs self-aligned contacts.
Figure 2B:
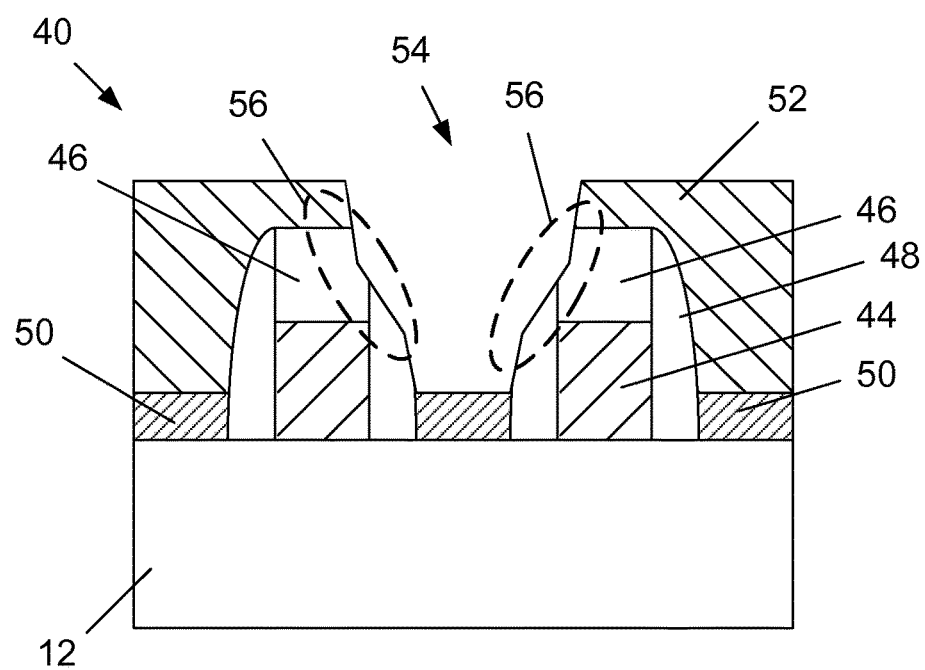

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned device level contact structures on integrated circuit products. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 3I:
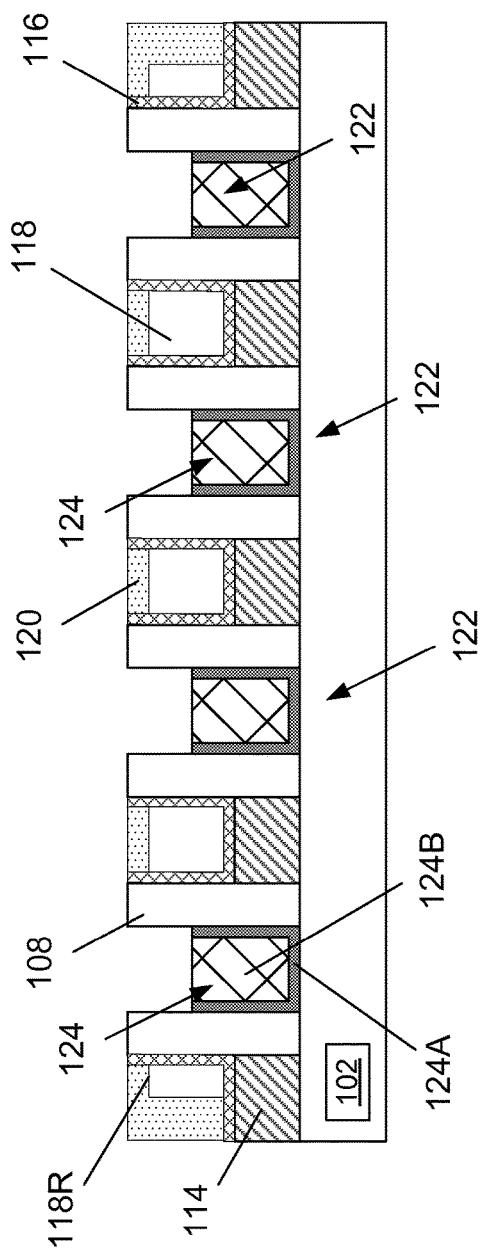
FIGS. 3A-3S depict one illustrative method disclosed herein for forming self-aligned device level contact structures on integrated circuit products.
Figure 3J:
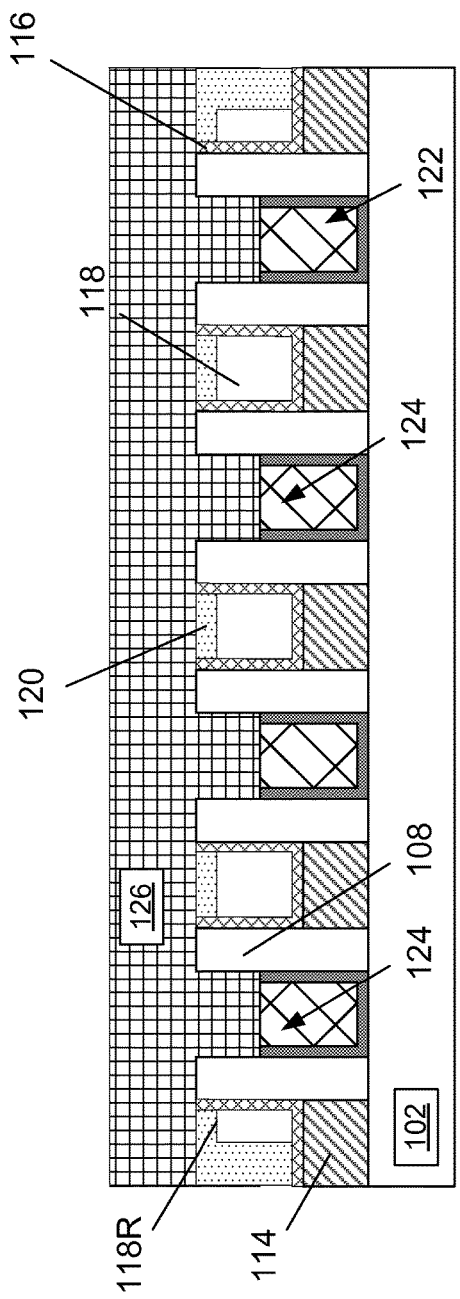
Figure 3K:
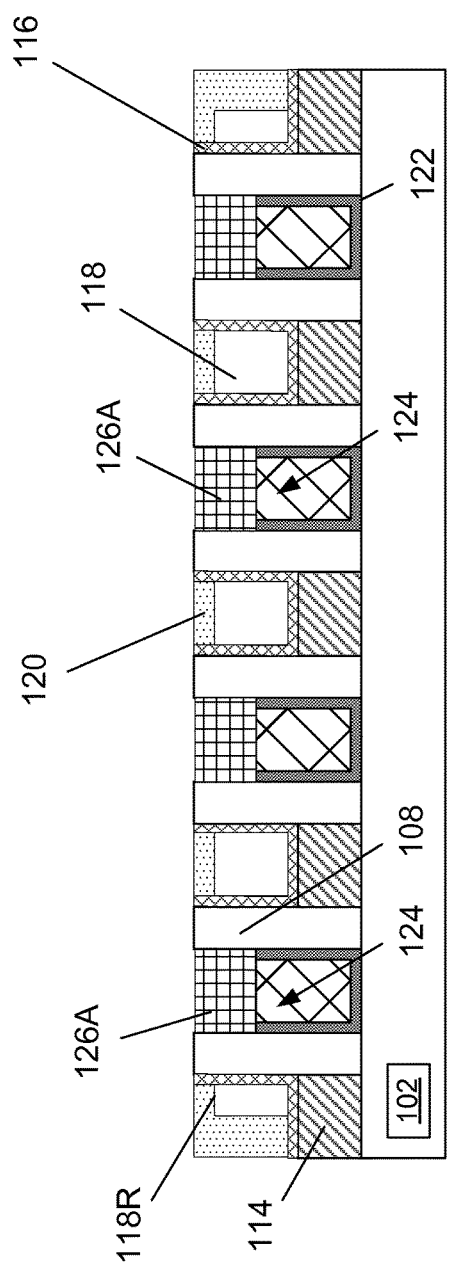
Figure 3L:
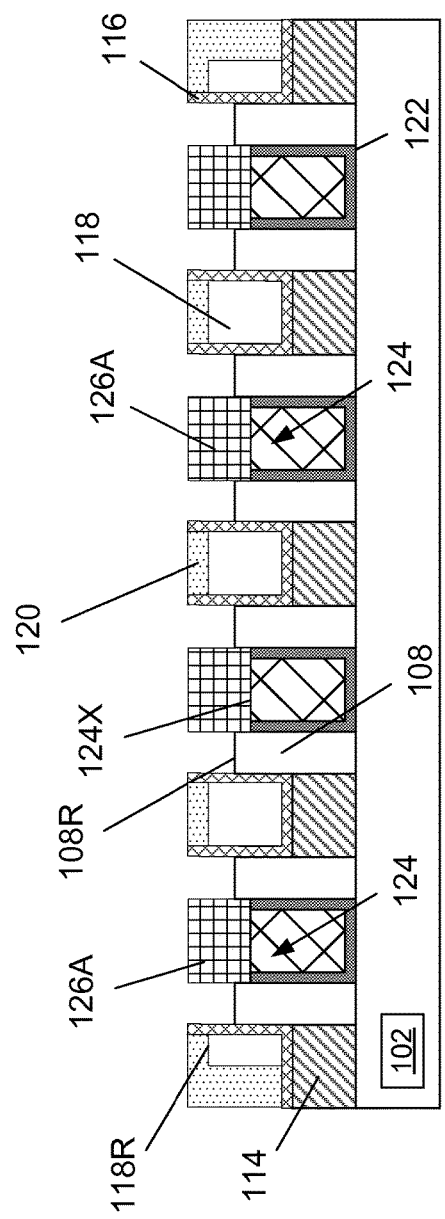
Figure 3S:
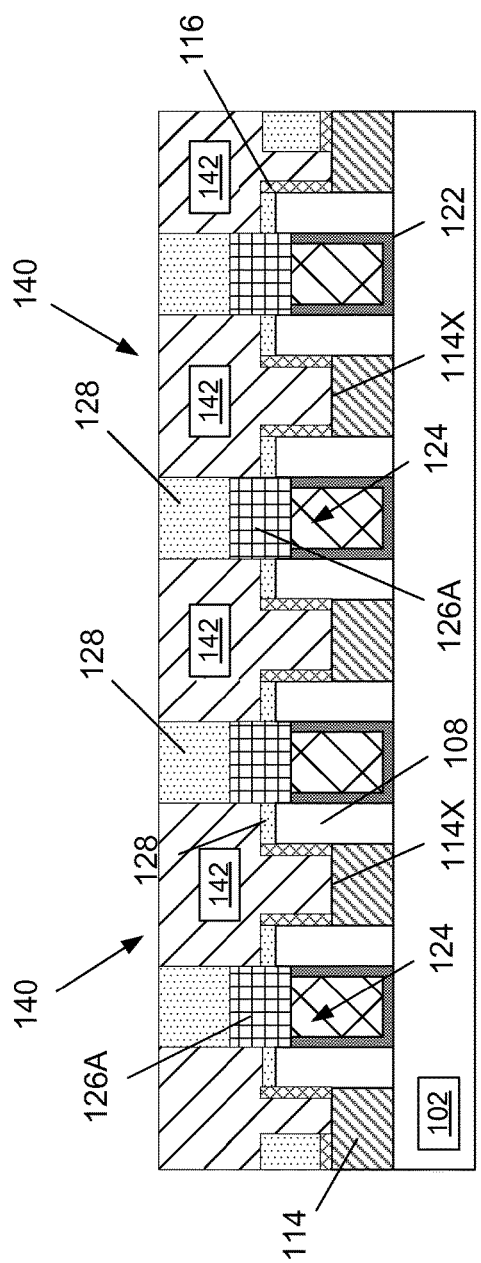

FIGS. 3A-3S depict one illustrative method disclosed herein for forming self-aligned device level contact structures on integrated circuit products. The illustrative product 100 will be formed in and above the semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

As noted above, the subject matter disclosed herein may be employed where the gate structures for the illustrative transistor devices may be formed using well-known "gate first" or "replacement gate" manufacturing techniques. In the example depicted in FIGS. 3A-3S, the subject matter disclosed herein will be described in the context of using a replacement gate manufacturing technique. Accordingly, FIG. 3A depicts the product 100 at a point in fabrication wherein several process operations have been performed. First, a plurality of illustrative gate structures 104 were formed above the substrate 102. Each of the gate structures 104 includes a schematically depicted sacrificial gate structure 106, a sidewall spacer 108 and a gate cap layer 110. The sacrificial gate structure 106 typically includes a sacrificial gate insulation layer (not separately shown), such as silicon dioxide, and a dummy or sacrificial gate electrode (not separately shown), such as polysilicon or amorphous silicon. The sidewall spacer 108 and the gate cap layer 110 are typically comprised of silicon nitride. The gate structures 104 may be formed using well-known processing techniques. After the gate structures 104 were formed, an epi semiconductor material 114 was formed in the source/drain regions 113 of the transistor devices. The epi semiconductor material 114 need not be formed in all applications. The physical size of the gate structures 104 and the gate pitch for the gate structures may vary depending upon the particular application.

FIG. 3B depicts the product 100 after a etch stop layer 116 was formed on the product 100 by performing a conformal deposition process. The etch stop layer 116 may be comprised of a variety of materials, e.g., silicon dioxide, etc., and it may be formed by performing a conformal ALD or CVD process. The thickness of the etch stop layer 116 may vary depending upon the particular application, e.g., 3-6 nm.

FIG. 3C depicts the product 100 after a layer of material 118 was formed on the product 100 by performing a conformal deposition process. The layer of material 118 may be comprised of a variety of materials, e.g., silicon nitride, etc., and it may be formed by performing a conformal ALD or CVD process. The thickness of the layer of material 118 may vary depending upon the particular application, e.g., 20-30 nm. Given the pitch between the gate structures 104, the layer of material 118 will typically "pinch-off" in the space between adjacent gate structures 104 above the source/drain regions 113 so as to substantially fill the space between adjacent gate structures 104. Of course, some voids may be present in the material 118 positioned between adjacent gate structures 104.

FIG. 3D depicts the product 100 after a timed, recess etching process was performed on the layer of material 118. After the etching process, the recessed layer of insulating material has a recessed upper surface 118R that is positioned at a level that is below a level of an upper surface 106X of the sacrificial gate structure 106, e.g., by a distance of about 2-10 nm.

FIG. 3E depicts the product 100 after an illustrative layer of insulating material 120, e.g., silicon dioxide, was blanket deposited above the product 100.

FIG. 3F depicts the product 100 after one or more planarization processes (e.g., CMP) were performed to remove a portion of the layer of insulating material 120 and a portion of the etch stop layer 116. At the completion of the planarization process, the upper surfaces 110X of the gate cap layers 110 are exposed.

FIG. 3G depicts the product 100 after one or more planarization processes (e.g., CMP) were performed to remove the gate cap layers 110 and portions of the sidewall spacers 108 so as to thereby expose the upper surface 106X of the sacrificial gate structure 106 for further processing, i.e., so that the sacrificial gate structure 106 can be removed.

FIG. 3H depicts the product 100 after one or more wet or dry etching processes were performed to remove the sacrificial gate structures 106 (gate insulation layer plus gate electrode) to thereby define a plurality of gate cavities 122 where replacement gate structures will subsequently be formed for the product 100. Typically, the sacrificial gate insulation layer (not separately shown) is removed as part of the replacement gate technique. Even in cases where the sacrificial gate insulation layer is intentionally removed, there may typically be a very thin native oxide layer (not shown) that forms on the surface of the substrate within the gate cavities 122.

The next major process sequence involves formation of the replacement gate structures 124 for the product 100. The replacement gate structures 124 that will be depicted herein are intended to be representative in nature of any type of gate structure that may be employed in manufacturing integrated circuit products using so-called gate-last (replacement-gate) manufacturing techniques. Of course, as noted above, the presently disclosed inventions may be employed in situations where the gate structures for the transistor devices are formed using well-known gate first manufacturing techniques. In the context of an illustrative replacement gate process, with reference to FIG. 3I, a pre-clean process was performed in an attempt to remove all foreign materials from within the gate cavities 122 prior to forming the various layers of material that will become part of the replacement gate structures 124. Next, a high-k (k value greater than 10) gate insulation layer 124A, such as hafnium oxide (or the other high-k materials), was deposited across the substrate 102 and within the gate cavities 122 by performing a conformal deposition process.

Thereafter, multiple conductive layers, such as metal layers, were sequentially deposited above the substrate 102 and within the gate cavities 122 such that the gate cavities 122 were substantially overfilled with material. Then, one or more CMP processes were performed to remove excess materials positioned outside of the gate cavities 122. Next, one or more recess etching processes were performed to recess the materials within the gate cavities 122 so as to thereby make room for a gate cap layer. These process operations result in the definition of the illustrative and simplistically depicted replacement gate structures 124B depicted in FIG. 3I.

FIG. 3J depicts the product 100 after a layer of insulating material 126 (e.g., silicon dioxide) was formed above the product 100 using traditional deposition techniques. The layer of insulating material 126 over-fills the recess above the replacement gate structures 124 within the gate cavities 122.

FIG. 3K depicts the product 100 after one or more planarization processes (e.g., CMP) were performed on the layer of insulating material 126 such that the upper surface of the layer of insulating material 126 is substantially even with the upper surface of the spacers 108. This process operation results in a plurality of gate cap layers 126A positioned above the replacement gate structures 124. Importantly, unlike traditional manufacturing techniques, in this embodiment, the method disclosed herein involves the formation of gate cap layers 126A made of silicon dioxide as compared to traditional gate cap layers that are typically made of silicon nitride. As noted above, the present subject matter can be employed when forming self-aligned contacts on integrated circuit products wherein gate structures may be formed using so-called "gate-first" manufacturing techniques. An analogous structure to that depicted in FIG. 3K, wherein the transistors were made using gate first manufacturing techniques could be made as follows. Rather than forming the dummy or sacrificial gate structures 106, the materials for the gate insulation layer (silicon dioxide or a high k material), the gate electrode (polysilicon or metal layers) and a gate cap material (silicon dioxide) could be initially formed across the substrate 102. Thereafter, all of these materials could then be patterned so as to define a basic gate structure with a silicon dioxide gate cap layer on top of the gate electrode. Sidewall spacers 108 (e.g., silicon nitride) could then be formed adjacent each of the gate structures. The etch stop layer 116 and the silicon nitride layer 118 could then be formed as shown in FIGS. 3C-3D. At that point, processing would continue with the formation of the layer 120 (FIG. 3E) and polishing that would stop on the nitride spacers 108. These steps would result in the structure depicted in FIG. 3K but the gates would be manufactured using a gate first manufacturing technique.

FIG. 3L depicts the product 100 after a timed, spacer recess etching process was performed to reduce the height of the spacers 108 such that they have a recessed upper surface 108R. The spacer recess etching process is performed for such a duration that the recessed surface 108R of the spacers 108 is positioned at a level that is above a level of the upper surface 124X of the replacement gate structures 124, e.g., by a distance of about 3-5 nm.

FIG. 3M depicts the product 100 after several processing operations were performed. First, another layer of insulating material 128 (e.g., silicon dioxide) was formed above the product 100 using traditional deposition techniques. Then, a hard mask layer 130, e.g., silicon nitride was formed above the layer of insulating material 128. The material layers 128, 130 may be formed to any desired thickness.

In the example depicted herein, the pitch of the gate structures 124 is such that the final pattern for the contact openings will be defined in the hard mask layer 130 by performing two separate masking and etching processes. Of course, in some applications, the final pattern for the contact openings may be defined in the hard mask layer 130 by performing a single masking and etching process. Accordingly, FIG. 3N depicts the product 100 after a first plurality of openings 130A were defined in the hard mask layer 130 by performing an etching process through a first patterned photoresist mask (not shown), and after the first photoresist mask was stripped. FIG. 3O depicts the product 100 after a second plurality of openings 130B were defined in the hard mask layer 130 by performing an etching process through a second patterned photoresist mask (not shown), and after the second photoresist mask was stripped. These process operations result in the formation of a patterned hard mask layer 130X having openings corresponding to the contact openings for the self-aligned contacts.

FIG. 3P depicts the product 100 after an etching process was performed to remove the exposed portions of the silicon dioxide materials (layers 128, 120, 116) not covered by the patterned hard mask layer 130X. The duration of this etching process is such that it is stopped when the upper surface 118R of the silicon nitride material 118 is exposed.

FIG. 3Q depicts the product 100 after an etching process was performed to remove the exposed silicon nitride material 118 above the silicon dioxide etch stop layer 116 that is positioned on the upper surface of the source/drain region. Note that during this etching process, the patterned hard mask layer 130X is also etched away. These operations result in the formation of a plurality of self-aligned contact openings 140.

FIG. 3R depicts the product 100 after, in one illustrative embodiment, an anisotropic etching process was performed through the self-aligned contact openings 140 to remove portions of the silicon dioxide etch stop layer 116 and thereby expose a portion of the upper surface of the source/drain region, e.g., in this example, a portion of the upper surface 114X of the epi material 114. In another illustrative embodiment, an isotropic etch process may be performed in lieu of an anisotropic etching process. If performed, such an isotropic etching process would remove all of the etch stop layer 116 and perhaps consume some amount of the layer 128 and the gate cap layers 126A. However, given the relative small thickness of the etch stop layer 116, the consumption of the layer 128 and the gate cap layers 126A would be relatively limited. If an isotropic etching process were to be performed, it would expose more of the upper surface of the source/drain region, thereby ultimately reducing contact resistance. As noted above, the epi material 114 need not be formed in all applications where the presently disclosed inventions may be used.

FIG. 3S depicts the product 100 after several process operations were performed to form a conductive source/drain contact structure 142 for each of the source/drain regions of the product 100. Gate contact structures (not shown) that are conductively coupled to each of the replacement gate structures 124 may also be formed as part of these process operations. The source/drain contact structures 142 may be of any desired cross-sectional configuration when viewed from above, e.g., square, rectangular, round, line-type, etc. The source/drain contact structures 142 are intended to be schematic and representative in nature, as they may be formed using any of a variety of different conductive materials and by performing traditional manufacturing operations. The contact structures 142 may also contain one or more barrier layers (not depicted). In one illustrative example, the contact structures 142 may be formed by depositing a liner, e.g., Ti, TiN, followed by overfilling the contact openings with a conductive material, such as tungsten or cobalt. Thereafter, a CMP process may be performed to planarize the upper surface of the layer of insulating material 128, which results in the removal of excess portions of the liner and the tungsten (or cobalt) positioned above the layer of insulating material 128 outside of the contact openings 140 and the formation of the contact structures 142.

One advantage of the presently disclosed subject matter lies in the fact that the process of forming the self-aligned contact openings 140 (see FIG. 3Q) involves performing an etching process to selectively remove silicon nitride material (the layer 118) relative to silicon dioxide materials (layer 128, the gate cap layer 126A, the layer 120 and the etch stop layer 116). Removing silicon nitride relative to silicon dioxide is much easier than removing silicon dioxide relative to silicon nitride due to the stronger bonds in silicon dioxide material as compared to silicon nitride material. Thus, by using the silicon nitride material 118 in the space between the gate structures (above the source/drain regions), the silicon dioxide gate cap layer 126A and the silicon dioxide etch stop layer 116, the formation of the self-aligned contact openings 140 is easier to accomplish and it can be accomplished more quickly than was the case with typical prior art processing techniques wherein silicon dioxide material was positioned in the space between the gate structures, the transistor had a silicon nitride gate cap layer and a silicon nitride etch stop layer was formed above the source/drain regions.

Figure 4A:
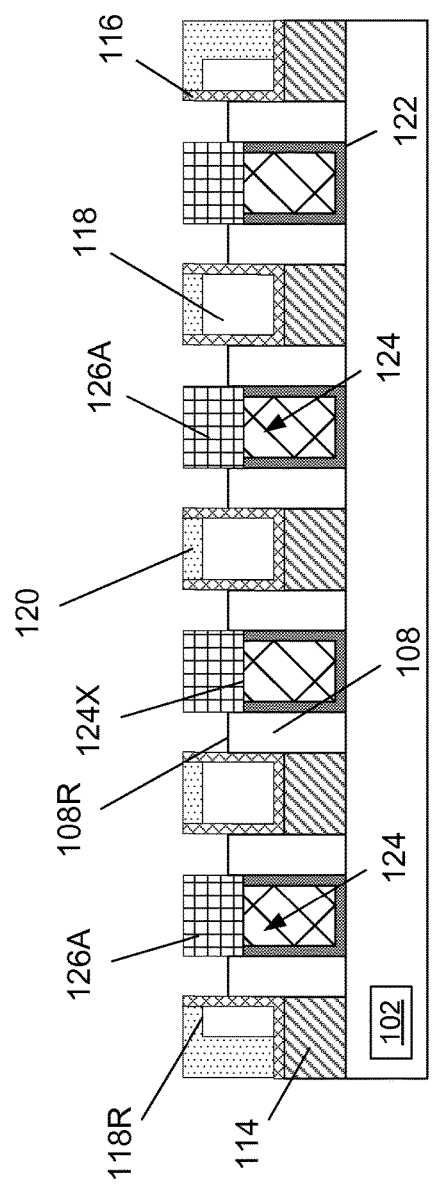

FIGS. 4A-4I depict another illustrative method disclosed herein for forming self-aligned device level contact structures on integrated circuit products. FIG. 4A depicts the product 100 at a point in fabrication that corresponds to that shown in FIG. 3L, i.e., after the spacers 108 were recessed.

FIGS. 4B-4C depict the product 100 after several processing operations were performed. First, a layer of insulating material 144 (e.g., silicon dioxide) was formed above the product 100 using traditional deposition techniques. The material 144 fills the space above the recessed spacers 108. Then, one or more planarization processes (e.g., CMP) were performed that ultimately stop on the recessed upper surface 118R of the silicon nitride material layer 118 (as shown in FIG. 4C) thereby exposing the silicon nitride material 118 for further processing.

FIG. 4D depicts the product 100 after several processing operations were performed. First, a thin layer of silicon nitride 150 (e.g., 2-5 nm) was formed on the product 100. Then, another layer of insulating material 152 (e.g., silicon dioxide) was formed on the thin layer of silicon nitride 150. Then, a hard mask layer 154, e.g., silicon nitride was formed above the layer of insulating material 152. The material layers 150, 152 may be formed to any desired thickness and all of the layers 150, 152 and 154 may be formed using traditional manufacturing techniques.

As noted above, in the example depicted herein, the pitch of the gate structures 124 is such that the final pattern for the contact openings will be defined in the hard mask layer 154 by performing two separate masking and etching processes, just like the process described above for the hard mask layer

130. Accordingly, FIG. 4E depicts the product 100 after multiple etching processes were performed to define a patterned hard mask layer 154X having openings corresponding to the contact openings 140 for the self-aligned contacts.

Figure 4F:
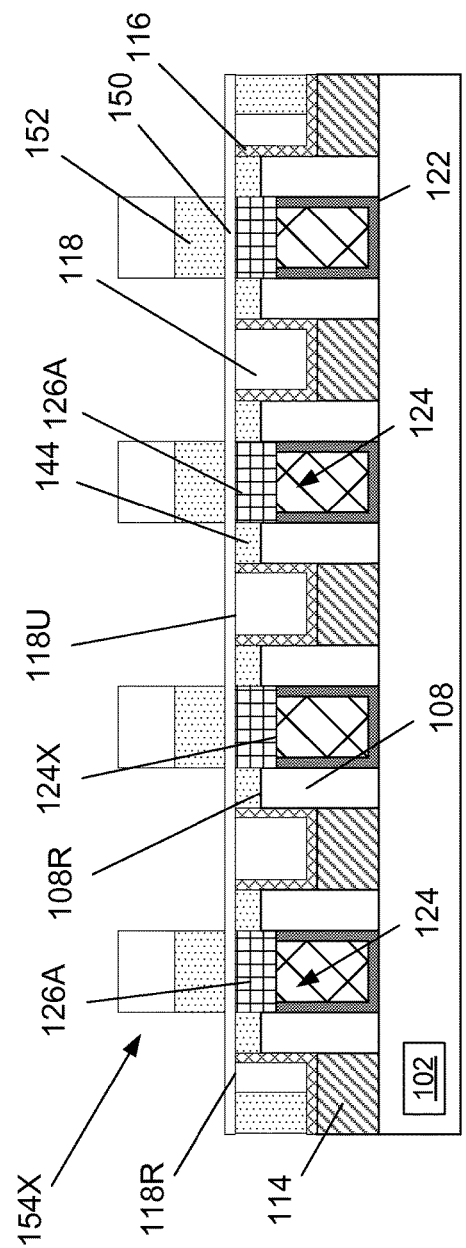

FIG. 4F depicts the product 100 after an etching process was performed to remove the exposed portions of the silicon dioxide material layer 152 not covered by the patterned hard mask layer 154X. This etching process stops on the silicon nitride layer 150.

Figure 4G:
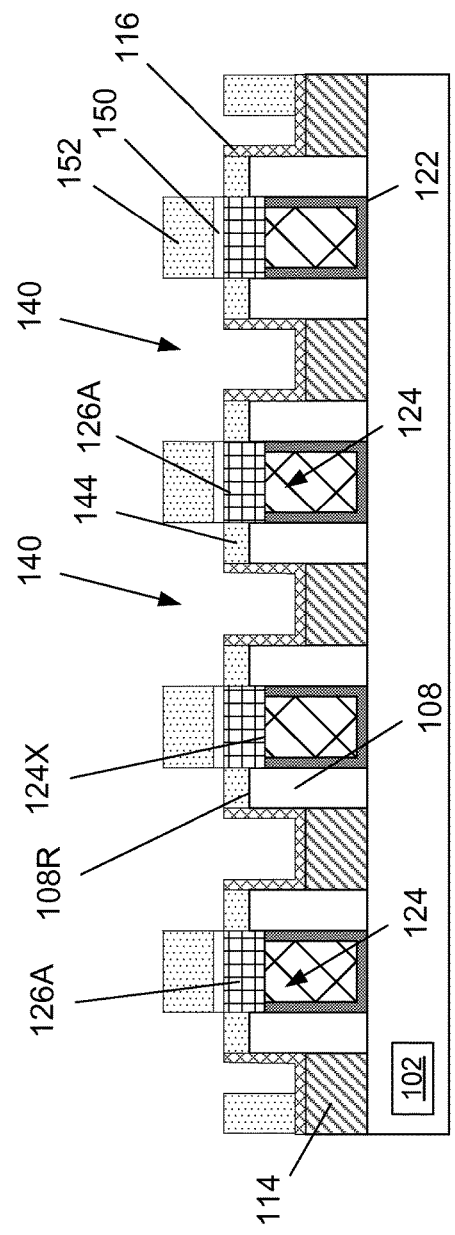

FIG. 4G depicts the product 100 after an etching process was performed to remove the exposed silicon nitride material layer 150 and the silicon nitride material layer 118 above the silicon dioxide etch stop layer 116 that is positioned on the upper surface of the source/drain regions. Note that, during this etching process, the patterned hard mask layer 154X is also etched away. This results in the formation of a plurality of self-aligned contact openings 140.

FIG. 4H depicts the product 100 after an anisotropic etching process was performed through the self-aligned contact openings 140 to remove portions of the silicon dioxide etch stop layer 116 and thereby expose a portion of the upper surface of the source/drain region, e.g., in this example, a portion of the upper surface 114X of the epi material 114. As noted above, the epi material 114 need not be formed in all applications where the presently disclosed inventions may be used.

FIG. 4I depicts the product 100 after the formation of the above-described conductive source/drain contact structures 142 for each of the source/drain regions of the product 100. As with the previous embodiment, this embodiment also involves selectively removing silicon nitride materials relative to silicon dioxide materials to thereby form the self-aligned contact openings 140 which provide significant benefits relative to prior art processing methods.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive self-aligned contact for an integrated circuit product, comprising:
    forming a silicon dioxide etch stop layer on and in contact with a source/drain region and adjacent silicon nitride sidewall spacers positioned on two laterally spaced-apart transistors having silicon dioxide gate cap layers, said silicon dioxide etch stop layer comprising sidewall portions covering said silicon nitride sidewall spacers and a bottom portion covering said source/drain region;
    forming a silicon nitride material on and in contact with said silicon dioxide etch stop layer and above said source/drain region, said silicon nitride material substantially filling a space defined between said sidewall portions and above said bottom portion of said silicon dioxide etch stop layer;
    forming a layer of insulating material above said two laterally spaced-apart transistors and above said silicon nitride material positioned on said silicon dioxide etch stop layer;
    forming an opening in said layer of insulating material that exposes said silicon nitride material positioned on said silicon dioxide etch stop layer;
    performing a first etching process to remove said silicon nitride material positioned on said silicon dioxide etch stop layer so as to thereby define a self-aligned contact opening, wherein portions of said silicon dioxide gate cap layers on said two laterally spaced-apart transistors are exposed to said first etching process;
    performing a second etching process through said self-aligned contact opening so as to remove a portion of said silicon dioxide etch stop layer and thereby expose a portion of said source/drain region;
    forming said conductive self-aligned contact in said self-aligned contact opening such that said self-aligned contact is conductively coupled to said source/drain region.

2. The method of claim 1, wherein each of said two laterally spaced-apart transistors have a gate structure comprised of a high-k gate insulation material and a gate electrode comprised of at least one layer of metal.

3. The method of claim 1, wherein each of said two laterally spaced-apart transistors have a gate structure comprised of a silicon dioxide gate insulation material and a gate electrode comprised of polysilicon.

4. The method of claim 1, wherein said layer of insulating material is a layer of silicon dioxide.

5. The method of claim 1, wherein performing said first etching process comprises performing an etching process that removes silicon nitride selectively to silicon dioxide.

6. The method of claim 1, wherein forming said silicon dioxide etch stop layer comprises forming said silicon dioxide etch stop layer on and in contact with a source/drain region and on and in contact with said silicon nitride sidewall spacers.

7. The method of claim 1, wherein each of said two laterally spaced-apart transistors having a silicon dioxide gate cap layer are formed by:
    forming a sacrificial gate structure with a silicon nitride gate cap layer positioned on a sacrificial gate electrode;
    forming one of said silicon nitride spacers adjacent said sacrificial gate structure;
    removing said silicon nitride gate cap layer;
    removing said sacrificial gate structure so as to thereby define a replacement gate cavity laterally defined by said silicon nitride spacer;
    forming a replacement gate structure in said replacement gate cavity;
    depositing a layer of silicon dioxide in said replacement gate cavity and on said replacement gate structure; and
    performing a planarization process to remove a portion of said layer of silicon dioxide so as to thereby define said silicon dioxide gate cap layer positioned on said replacement gate structure.

8. The method of claim 7, wherein forming said silicon dioxide etch stop layer comprises forming said silicon dioxide etch stop layer prior to removing said silicon nitride gate cap layer and the method further comprises performing a CMP process to remove a portion of said silicon dioxide etch stop layer so as to expose said silicon nitride gate cap layer prior to removing said silicon nitride gate cap layer.

9. The method of claim 1, wherein each of said two laterally spaced-apart transistors having a silicon dioxide gate cap layer are formed by:
  forming a gate insulation layer above a substrate;
  blanket depositing a layer of gate electrode material above said gate insulation layer;
  blanket depositing a layer of silicon dioxide on said layer of gate electrode material;
  patterning at least said layer of silicon dioxide and said layer of gate electrode material to define a gate electrode and a gate cap layer made of silicon dioxide on said gate electrode; and
  forming one of said silicon nitride spacers adjacent said gate electrode.

10. The method of claim 9, wherein forming said silicon dioxide etch stop layer comprises forming said silicon dioxide etch stop layer after performing said step of patterning at least said layer of silicon dioxide and said layer of gate electrode material.

11. The method of claim 1, wherein forming said silicon dioxide etch stop layer comprises performing a conformal deposition process to form said silicon dioxide etch stop layer.

12. The method of claim 1, wherein, after forming said silicon nitride material on and in contact with said silicon dioxide etch stop layer, and prior to forming said layer of insulating material above said two laterally spaced-apart transistors, the method further comprises forming a layer of silicon nitride material on and in contact with an upper surface of said silicon dioxide gate cap layers.

13. The method of claim 12, wherein forming said layer of insulating material above said two laterally spaced-apart transistors comprises forming said layer of insulating material above said two laterally spaced-apart transistors and on and in contact with an upper surface of said layer of silicon nitride material that is positioned on and in contact with said upper surface of said silicon dioxide gate cap layers.

14. A method of forming a conductive self-aligned contact for an integrated circuit product comprising first and second laterally spaced apart transistor devices with a source/drain region positioned between said first and second transistor devices, the method comprising:
  forming first and second gate structures and first and second silicon nitride sidewall spacers positioned adjacent sidewalls of each of said first and second gate structures, respectively, each of said first and second gate structures comprising a gate electrode, a gate insulation layer and a silicon dioxide gate cap layer positioned on and in contact with said gate electrode;
  performing a conformal deposition process to form a silicon dioxide etch stop layer on and in contact with said source/drain region and on and in contact with said first and second sidewall spacers, said silicon dioxide etch stop layer comprising sidewall portions covering said first and second sidewall spacers and a bottom portion covering said source/drain region;
  forming a silicon nitride material on and in contact with said silicon dioxide etch stop layer and above said source/drain region, said silicon nitride material substantially filling a space defined between said sidewall portions and above said bottom portion of said silicon dioxide etch stop layer;
  forming a layer of silicon dioxide above said first and second gate structures and above said silicon nitride material positioned on and in contact with said silicon dioxide etch stop layer;
  performing a first etching process to define an opening in said layer of silicon dioxide that exposes said silicon nitride material positioned on and in contact with said silicon dioxide etch stop layer;
  performing a second etching process to remove said silicon nitride material positioned on and in contact with said silicon dioxide etch stop layer so as to thereby define a self-aligned contact opening;
  performing a third etching process through said self-aligned contact opening so as to remove a portion of said silicon dioxide etch stop layer and thereby expose a portion of said source/drain region; and
  forming said conductive self-aligned contact in said self-aligned contact opening such that said self-aligned contact is conductively coupled to said source/drain region.

15. The method of claim 14, wherein performing said second etching process comprises performing an etching process that removes silicon nitride selectively to silicon dioxide.

16. The method of claim 14, wherein forming said silicon dioxide etch stop layer comprises performing a conformal deposition process to form said silicon dioxide etch stop layer.

17. The method of claim 14, wherein, after forming said silicon nitride material on and in contact with said silicon dioxide etch stop layer, and prior to forming said layer of silicon dioxide above said first and second gate structures, the method further comprises forming a layer of silicon nitride material on and in contact with an upper surface of said silicon dioxide gate cap layers.

18. The method of claim 17, wherein forming said layer of silicon dioxide above said first and second gate structures comprises forming said layer of silicon dioxide above said first and second gate structures and on and in contact with an upper surface of said layer of silicon nitride material that is positioned on and in contact with said upper surface of said silicon dioxide gate cap layers.

19. A method of forming a conductive self-aligned contact for an integrated circuit product, the method comprising:
  forming a silicon dioxide etch stop layer on and in contact with a source/drain region and adjacent silicon nitride sidewall spacers positioned on two laterally spaced-apart transistors having silicon dioxide gate cap layers;
  forming a silicon nitride material on and in contact with said silicon dioxide etch stop layer and above said source/drain region;
  after forming said silicon nitride material on and in contact with said silicon dioxide etch stop layer, forming a layer of silicon nitride material on and in contact with an upper surface of said silicon dioxide gate cap layers and thereafter forming a layer of insulating material above said two laterally spaced-apart transistors and above said silicon nitride material positioned on said silicon dioxide etch stop layer;
  forming an opening in said layer of insulating material that exposes said silicon nitride material positioned on said silicon dioxide etch stop layer;
  performing a first etching process to remove said silicon nitride material positioned on said silicon dioxide etch stop layer so as to thereby define a self-aligned contact opening, wherein portions of said silicon dioxide gate cap layers on said two laterally spaced-apart transistors are exposed to said first etching process;

performing a second etching process through said self-aligned contact opening so as to remove a portion of said silicon dioxide etch stop layer and thereby expose a portion of said source/drain region; and forming said conductive self-aligned contact in said self-aligned contact opening such that said self-aligned contact is conductively coupled to said source/drain region.

20. A method of forming a conductive self-aligned contact for an integrated circuit product comprising first and second laterally spaced-apart transistor devices with a source/drain region positioned between said first and second transistor devices, the method comprising:

forming first and second gate structures and first and second silicon nitride sidewall spacers positioned adjacent sidewalls of each of said first and second gate structures, respectively, each of said first and second gate structures comprising a gate electrode, a gate insulation layer and a silicon dioxide gate cap layer positioned on and in contact with said gate electrode;

performing a conformal deposition process to form a silicon dioxide etch stop layer on and in contact with said source/drain region and on and in contact with said first and second sidewall spacers;

forming a silicon nitride material on and in contact with said silicon dioxide etch stop layer and above said source/drain region;

after forming said silicon nitride material on and in contact with said silicon dioxide etch stop layer, forming a layer of silicon nitride material on and in contact with an upper surface of said silicon dioxide gate cap layers and thereafter forming a layer of silicon dioxide above said first and second gate structures and above said silicon nitride material positioned on and in contact with said silicon dioxide etch stop layer;

performing a first etching process to define an opening in said layer of silicon dioxide that exposes said silicon nitride material positioned on and in contact with said silicon dioxide etch stop layer;

performing a second etching process to remove said silicon nitride material positioned on and in contact with said silicon dioxide etch stop layer so as to thereby define a self-aligned contact opening;

performing a third etching process through said self-aligned contact opening so as to remove a portion of said silicon dioxide etch stop layer and thereby expose a portion of said source/drain region; and forming said conductive self-aligned contact in said self-aligned contact opening such that said self-aligned contact is conductively coupled to said source/drain region.

* * * * *